United States Patent
Chiwata

(10) Patent No.: US 10,104,783 B2
(45) Date of Patent: Oct. 16, 2018

(54) METHOD FOR PRODUCING CERAMIC CIRCUIT BOARD

(71) Applicant: HITACHI METALS, LTD., Tokyo (JP)

(72) Inventor: Nobuhiko Chiwata, Kitakyushu (JP)

(73) Assignee: HITACHI METALS, LTD., Tokyo (JP)

(*) Notice: Subject to any disclaimer, the term of this patent is extended or adjusted under 35 U.S.C. 154(b) by 262 days.

(21) Appl. No.: 14/911,064

(22) PCT Filed: Mar. 12, 2014

(86) PCT No.: PCT/JP2014/056534
§ 371 (c)(1),
(2) Date: Feb. 9, 2016

(87) PCT Pub. No.: WO2015/029478
PCT Pub. Date: Mar. 5, 2015

(65) Prior Publication Data
US 2016/0192503 A1    Jun. 30, 2016

(30) Foreign Application Priority Data
Aug. 29, 2013 (JP) ................................. 2013-177709

(51) Int. Cl.
*H05K 3/02* (2006.01)
*H05K 3/06* (2006.01)
(Continued)

(52) U.S. Cl.
CPC ........... *H05K 3/067* (2013.01); *C04B 35/584* (2013.01); *C04B 37/026* (2013.01); *C04B 41/91* (2013.01);
(Continued)

(58) Field of Classification Search
CPC ..... C04B 35/584; C04B 37/026; C04B 41/91; H01L 23/3735; H01L 21/4846;
(Continued)

(56) References Cited

U.S. PATENT DOCUMENTS 5,807,626 A * 9/1998 Naba .................... B23K 1/0016
  174/259
6,054,762 A * 4/2000 Sakuraba ................ H01L 23/13
  257/700
(Continued)

FOREIGN PATENT DOCUMENTS

JP     09-162325 A    6/1997
JP     10-154866 A    6/1998
(Continued)

OTHER PUBLICATIONS

Communication dated Feb. 8, 2016, from the European Patent Office in counterpart European Application No. 14840942.8.
(Continued)

*Primary Examiner* — Paul D Kim
(74) *Attorney, Agent, or Firm* — Sughrue Mion, PLLC

(57) ABSTRACT

A method for producing a ceramic circuit board comprising the steps of bonding a metal sheet to a ceramic substrate via a brazing material containing Ag to form a bonded body; etching the bonded metal sheet to form a circuit pattern; and removing an unnecessary brazing material from the substrate provided with the circuit pattern, by etching with an acidic solution comprising carboxylic acid and/or carboxylate and hydrogen peroxide.

14 Claims, 2 Drawing Sheets

(51) Int. Cl.

| | |
|---|---|
| *H05K 3/26* | (2006.01) |
| *H01L 23/373* | (2006.01) |
| *H01L 21/48* | (2006.01) |
| *C04B 35/584* | (2006.01) |
| *C04B 37/02* | (2006.01) |
| *H05K 3/38* | (2006.01) |
| *C04B 41/91* | (2006.01) |
| *H01L 23/12* | (2006.01) |
| *H05K 1/03* | (2006.01) |
| *H01L 23/15* | (2006.01) |

(52) U.S. Cl.
CPC .......... *H01L 21/4846* (2013.01); *H01L 23/12* (2013.01); *H01L 23/3735* (2013.01); *H05K 3/26* (2013.01); *H05K 3/38* (2013.01); *H05K 3/388* (2013.01); *C04B 2235/3206* (2013.01); *C04B 2235/3225* (2013.01); *C04B 2235/6025* (2013.01); *C04B 2237/124* (2013.01); *C04B 2237/125* (2013.01); *C04B 2237/127* (2013.01); *C04B 2237/366* (2013.01); *C04B 2237/368* (2013.01); *C04B 2237/407* (2013.01); *H01L 23/15* (2013.01); *H01L 2924/0002* (2013.01); *H05K 1/0306* (2013.01); *H05K 2201/0355* (2013.01); *H05K 2203/0789* (2013.01)

(58) Field of Classification Search
CPC ....... H01L 23/12; H01L 23/15; H05K 1/0306; H05K 3/067; H05K 3/26; H05K 3/38; H05K 3/388
See application file for complete search history.

(56) References Cited

U.S. PATENT DOCUMENTS

| | | | |
|---|---|---|---|
| 6,918,529 | B2 | 7/2005 | Tsukaguchi et al. |
| 7,219,826 | B2 * | 5/2007 | Nakamura .......... H01L 23/3735 228/112.1 |
| 2001/0051440 | A1 * | 12/2001 | Torek ...................... C09K 13/08 438/745 |
| 2003/0066865 | A1 | 4/2003 | Tsukaguchi et al. |
| 2004/0069528 | A1 * | 4/2004 | Sakuraba ............ H01L 23/3735 174/257 |
| 2004/0262367 | A1 | 12/2004 | Nakamura |
| 2010/0051066 | A1 | 3/2010 | Kuwabara et al. |

FOREIGN PATENT DOCUMENTS

| | | |
|---|---|---|
| JP | 10-251878 A | 9/1998 |
| JP | 3353990 B2 | 12/2002 |
| JP | 2003-110222 A | 4/2003 |
| JP | 2005-035874 A | 2/2005 |
| JP | 3629783 B2 | 3/2005 |
| JP | 2006-351988 A | 12/2006 |
| JP | 2008-147446 A | 6/2008 |
| JP | 2009-256207 A | 11/2009 |
| JP | 2012-234857 A | 11/2012 |
| KR | 20030079322 A | 10/2003 |

OTHER PUBLICATIONS

Japanese Notice of Reason for Refusal issued in JP 2014-549842 dated Jan. 6, 2015.
International Search Report of PCT/JP2014/056534 dated Jun. 10, 2014.
Communication dated Jul. 19, 2018, issued by the European Patent Office in corresponding European Application No. 14 840 942.8.

* cited by examiner

METHOD FOR PRODUCING CERAMIC CIRCUIT BOARD

CROSS REFERENCE TO RELATED APPLICATIONS

This is a National Stage of International Application No. PCT/JP2014/056534 filed Mar. 12, 2014 (claiming priority based on Japanese Patent Application No. 2013-177709 filed Aug. 29, 2013), the contents of which are incorporated herein by reference in their entirety.

FIELD OF THE INVENTION

The present invention relates to a method for producing a ceramic circuit board used for power modules, etc.

BACKGROUND OF THE INVENTION

To be used for power modules in electric vehicles (EV), etc., ceramic circuit boards comprising copper sheets bonded to ceramic substrates having good thermal conductivity via brazing materials have become increasingly demanded. Such circuit boards are generally produced by coating substrates of ceramics such as silicon nitride, aluminum nitride, etc. having high thermal conductivity with a brazing material containing an active metal; heat-bonding a metal sheet of copper, aluminum, etc. to the brazing material; printing a resist in a circuit pattern on the metal sheet; and removing unnecessary metal sheet portions covered with no resist by etching.

When a copper sheet is bonded to a sintered silicon nitride substrate with a brazing material comprising Ag, Cu, and Ti (active metal) as described in Japanese Patent 3,629,783, a layer bonding the copper sheet to the ceramic substrate, which is formed by a brazing material containing an active metal, is presumably constituted by an alloy layer comprising Cu and Ag as main components, which is formed on the copper sheet side, and a reaction product layer comprising titanium nitride as a main component, which is formed on the sintered silicon nitride side.

Unnecessary brazing material portions between circuit patterns are removed to some extent when the metal sheet is etched, but an alloy layer (for example, mainly composed of Cu—Ag) and a reaction product layer (for example, mainly composed of titanium nitride) in the brazing material may partially remain without being completely removed as the case may be. A partially remaining brazing material decreases insulation or causing short-circuiting between adjacent circuit patterns.

JP 2006-351988 A discloses the production of a ceramic circuit board by coating both surfaces of a ceramic plate (made of nitrides such as aluminum nitride, silicon nitride, etc.) with a brazing material comprising an active metal, bonding metal sheets to the ceramic plate, and etching a metal sheet with a mask. JP 2006-351988 A describes that because the brazing material, or its alloy layer and nitride layer remain on the ceramic circuit board after removing unnecessary metal sheet portions by etching, they are generally removed with an aqueous ammonium fluoride solution, and an aqueous solution comprising a mineral acid such as sulfuric acid, nitric acid, etc., and hydrogen peroxide. Though an aqueous etching solution containing ammonium fluoride for removing the brazing material can enough remove the reaction product layer mainly composed of titanium nitride, it cannot fully remove the alloy layer, partially leaving a residual brazing material, resulting in decreased insulation or short-circuiting between circuit patterns.

JP 9-162325 A discloses a silicon nitride circuit board comprising metal circuits with or without a heat-dissipating metal plate, each formed on a silicon nitride substrate via a bonding layer containing an active metal, the bonding layer being as thick as 20 μm or less, and the metal circuits and the heat-dissipating metal plate containing 50 ppm or less of oxygen. JP 9-162325 A describes that the silicon nitride circuit board is produced by coating the substrate with a brazing material paste containing an active metal or a compound containing an active metal, bonding metal sheets sufficiently wide to cover the paste, forming circuit patterns on the metal sheet of the bonded body with an etching resist, etching the metal sheet to form metal circuits, and removing the brazing material existing between the metal circuits. JP 9-162325 A describes that to remove the brazing material, a (warm) aqueous solution containing ammonium hydrogen fluoride ($NH_4F \cdot HF$), hydrogen peroxide ($H_2O_2$), etc. is used. Though an aqueous etching solution containing ammonium fluoride for removing the brazing material can effectively remove the reaction product layer mainly composed of titanium nitride, it cannot fully remove the alloy layer. Accordingly, the brazing material partially remains, resulting in decreased insulation or short-circuiting between circuit patterns.

To remove unnecessary brazing material portions between circuit patterns completely, it is known that after the copper sheet is etched, the brazing material is further etched. For example, JP 10-154866 A discloses a method comprising a first treatment with an aqueous solution containing ammonium fluoride and hydrogen peroxide, and a second treatment with an aqueous solution containing alkali and hydrogen peroxide. JP 10-154866 A describes that this method can completely remove unnecessary brazing material portions without decreasing the size precision of circuit patterns. However, the brazing-material-removing method described in JP 10-154866 A suffers the erosion of an etching resist with an aqueous alkali solution used.

JP 10-251878 A discloses a method of removing silver or silver chloride appearing by the etching treatment of a copper sheet with an aqueous solution of sodium thiosulfate and/or potassium thiosulfate, and removing residual silver or alloy thereof with an aqueous solution containing $NH_4F \cdot HF$ and hydrogen peroxide. JP 10-251878 A describes that an etching resist is not eroded by this method, because an alkaline solution is not used. Though an aqueous solution of sodium thiosulfate and/or potassium thiosulfate can effectively dissolve silver chloride, it does not reduce and dissolve metallic silver and silver alloy. Accordingly, the method of JP 10-251878 A fails to sufficiently remove metallic silver and a silver alloy, so that the brazing material may partially remain, resulting in decreased circuit board quality.

JP 2005-35874 A discloses a method for producing a metal-bonded ceramic substrate by bonding a metal member to at least one surface of a ceramic substrate via a brazing material containing an active metal; coating predetermined surface portions of the metal member with a resist; etching part of the metal member; removing the resist; etching part of the metal layer, which is made of a metal different from the active metal in the brazing material, for example, with an agent containing hydrogen peroxide, ammonia water and EDTA; and selectively etching the active metal layer. JP 2005-35874 A describes as agents for selectively etching the active metal layer, (a) an agent containing carboxylic acid

[citric acid, diethylenetriaminepentaacetic acid (DTPA), ethylenediaminetetraacetic acid (EDTA), hydroxyethylethylenediaminetriacetic acid (HEDTA), 1,3-propanediaminetriacetic acid (1,3PDTA), nitrilotriacetic acid (NTA), hydroxyethylidene 2-phosphoric acid (HEDT), etc.], an oxidizing agent, and alkali; or (b) an agent containing a compound having one or more amino groups in its molecule (ethylenediamine compound, etc.), an oxidizing agent, and acid.

However, the production method of a metal-bonded ceramic substrate described in JP 2005-35874 A suffers the corrosion of a metal member surface after removing the resist, because part of a layer made of a metal different from the active metal is removed, and the active metal layer is then selectively etched. When the resist-removing treatment is conducted finally, the method suffers the erosion of an etching resist with an aqueous alkali solution used for removing part of layers of a metal different from the active metal. Also, because an alkaline solution of the agent (a) containing carboxylic acid is used, the method suffers a similar problem. Accordingly, the development of brazing-material-removing technologies carried out in an acidic state has been desired.

OBJECT OF THE INVENTION

Accordingly, an object of the present invention is to provide a method for producing a ceramic circuit board by using a treating solution having high brazing-material-removing capability and good handleability, which does not corrode an etching resist to be removed by an alkaline solution.

SUMMARY OF THE INVENTION

As a result of intensive research in view of the above object, the inventor has found that an acidic solution comprising carboxylic acid and/or carboxylate and hydrogen peroxide has high capability of removing a brazing material containing Ag, and very good handleability, and that by a subsequent treatment with an acidic solution comprising ammonium fluoride and hydrogen peroxide, a trace amount of a residual brazing material can be removed to a practically acceptable level. The present invention has been completed based on such finding.

A usual production method of a ceramic circuit board comprises bonding a metal sheet to a ceramic substrate via a brazing material to form a bonded body, etching the bonded metal sheet to form a circuit pattern, and then further etching the circuit pattern. Etching with a conventional etching solution (for example, an aqueous solution comprising ammonium fluoride and hydrogen peroxide as described in JP 10-154866 A, etc.) leaves a residual brazing material. As a result of intensive research, the inventor has found that a residual brazing material remaining after the first brazing-material-etching treatment can be removed to a practically acceptable level, by dissolving at least part of a layer of an alloy of other metals than the active metal in the brazing material (for example, Cu—Ag layer) with a first brazing-material-etching solution containing acetic acid and hydrogen peroxide, and then dissolving a reaction product layer formed by the active metal in the brazing material (for example, titanium nitride layer) with a second brazing-material-etching solution containing ammonium fluoride and hydrogen peroxide. The inventor has further found that the alloy layer and the reaction product layer of active metal can be dissolved simultaneously in one etching solution obtained by combining components in the first and second brazing-material-etching solutions, thereby removing a residual brazing material to a practically acceptable level.

Thus, the method of the present invention for producing a ceramic circuit board comprises the steps of
bonding a metal sheet to a ceramic substrate via a brazing material containing Ag to form a bonded body;
etching the bonded metal sheet to form a circuit pattern; and
removing an unnecessary brazing material from the substrate provided with the circuit pattern, by etching with an acidic solution comprising carboxylic acid and/or carboxylate and hydrogen peroxide.

The substrate having an unnecessary brazing material removed is preferably further etched with an acidic solution comprising ammonium fluoride and hydrogen peroxide, to remove a residual brazing material.

The brazing material preferably contains Ag and an active metal.

The acidic solution comprising ammonium fluoride and hydrogen peroxide is preferably an aqueous solution comprising 0.7-2.1 mol/L of ammonium fluoride and 2.9-8.9 mol/L of hydrogen peroxide, and having pH of 5 or less.

The acidic solution comprising ammonium fluoride and hydrogen peroxide preferably further comprises at least one of sulfuric acid, urea, and phosphoric acid.

The acidic solution comprising carboxylic acid and/or carboxylate and hydrogen peroxide is preferably an aqueous solution comprising 0.083-1.7 mol/L of carboxylic acid and/or carboxylate and 2.9-8.9 mol/L of hydrogen peroxide, and having pH of 6 or less.

The acidic solution comprising carboxylic acid and/or carboxylate and hydrogen peroxide preferably further comprises at least one of sulfuric acid, urea, and phosphoric acid.

Another method of the present invention for producing a ceramic circuit board comprises the steps of
bonding a metal sheet to the ceramic substrate via a brazing material containing Ag to form a bonded body;
etching the bonded metal sheet to form a circuit pattern; and
removing an unnecessary brazing material from the substrate provided with the circuit pattern, by etching with an acidic solution comprising carboxylic acid and/or carboxylate, ammonium fluoride, and hydrogen peroxide.

The acidic solution comprising carboxylic acid and/or carboxylate, ammonium fluoride, and hydrogen peroxide is preferably an aqueous solution comprising 0.083-1.7 mol/L of carboxylic acid and/or carboxylate, 0.7-2.1 mol/L of ammonium fluoride, and 2.9-8.9 mol/L of hydrogen peroxide, and having pH of 6 or less.

The acidic solution comprising carboxylic acid and/or carboxylate, ammonium fluoride, and hydrogen peroxide preferably further comprises at least one of sulfuric acid, urea, and phosphoric acid.

The brazing material preferably contains Ag and an active metal.

It is preferable that the metal sheet is a copper sheet, and that a solution for etching the bonded metal sheet in the pattern-forming step is preferably a copper-etching solution.

The brazing material preferably contains Ag, Cu, and an active metal.

DESCRIPTION OF THE PREFERRED EMBODIMENTS

[1] Production Method of Ceramic Circuit Board (1) First Embodiment

The method for producing a ceramic circuit board according to the first embodiment of the present invention will be explained below. This method comprises bonding a metal sheet to a ceramic substrate via a brazing material containing Ag to form a bonded body;

etching the bonded metal sheet to form a circuit pattern; and removing an unnecessary brazing material from the substrate provided with the circuit pattern, by etching with an acidic solution comprising carboxylic acid and/or carboxylate and hydrogen peroxide.

(a) Bonding Step

Figure 1:
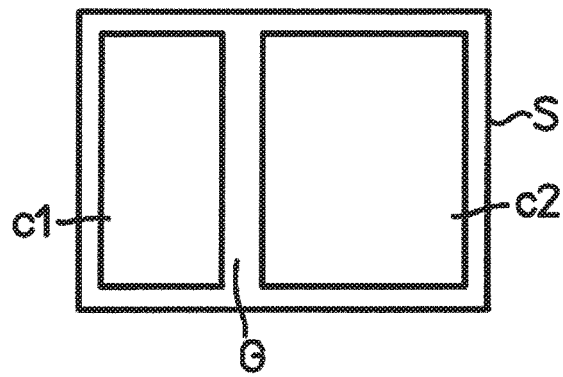
FIG. 1 is a plan view schematically showing a brazing material screen-printed onto a ceramic substrate.
Figure 2:
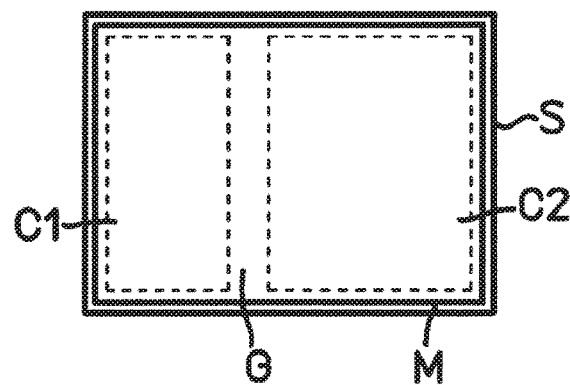
FIG. 2 is a plan view schematically showing a bonded body comprising a metal sheet bonded to a ceramic substrate via a brazing material.
Figure 3:
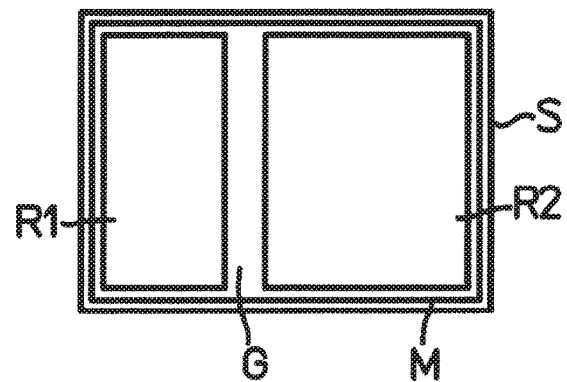
FIG. 3 is a plan view schematically showing a bonded body having a metal sheet, which is coated with a resist for forming desired circuit patterns.

As shown in FIG. 1, a surface of a ceramic substrate S (silicon nitride substrate, aluminum nitride substrate, etc.) are screen-printed with brazing materials C1, C2 containing an active metal to form patterns separate from each other via a gap G. A metal sheet M (copper sheet, aluminum sheet, etc.) is bonded under pressure to the ceramic substrate coated with the active-metal-containing brazing materials, and heated to the melting point of the active-metal-containing brazing material or higher in vacuum, or in an inert atmosphere such as an argon gas, etc., thereby forming a bonded body, in which the metal sheet M is integrally bonded to the ceramic substrate S via the brazing materials C1, C2 (see FIG. 2). The active-metal-containing brazing materials coated are preferably as thick as about 20-50 μm, to relax thermal expansion difference between the ceramic substrate and the metal sheet. The metal sheet M of the bonded body is provided with resist layers R1, R2 to form desired circuit patterns (see FIG. 3).

Likewise, a metal sheet M3 for a heat-dissipating plate is bonded to another surface of the ceramic substrate S with a brazing material C3 containing an active metal. In the production of a ceramic circuit board, because metal sheets M1, M2 for a circuit board, and a metal sheet M3 for a heat-dissipating plate are bonded basically in the same way, explanation will be made only on the metal sheets M1, M2, with the explanation of the metal sheet M3 omitted.

A brazing material used in the present invention contains at least Ag and an active metal. As other metals than Ag and the active metal, Cu is preferably contained, and In may be further contained. Inevitable impurities may be contained. The brazing material is preferably composed of Ag, Cu, and an active metal. The active metal is, for example, at least one of Ti, Zr and Hf.

The preferred brazing material powder is composed of alloy powder comprising 55-81% by mass of Ag, 1-5% by mass of In, 14-44% by mass of Cu, and inevitable impurities, Ag powder, and active metal hydride powder. In the alloy powder, a ratio of Ag/(Ag+Cu) is preferably 0.57-0.85. In the brazing material, the oxygen content is preferably 0.1% or less by mass, and the Si content is preferably 0.0001-0.5% by mass. The active metal hydride powder is preferably 1-3 parts by mass per 100 parts by mass of the alloy powder. The active metal hydride may be hydride of at least one metal selected from the group consisting of Ti, Zr and Hf, and is preferably Ti hydride.

The brazing material may be a paste suitable for screen-printing, which is obtained by blending 100% by mass of the metal components (the total of an active metal and other metals) with 1-10% by mass of a binder, and 2-20% by mass of an organic solvent.

The resist layers are preferably formed by an ultraviolet-curing resist. The ultraviolet-curing resist comprises a copolymer-type acrylate oligomer, an acrylate monomer, a filler, a photopolymerization initiator, a color-adjusting agent, a defoamer, and a leveling agent. The copolymer-type acrylate oligomer, a main component in the ultraviolet-curing resist, is a high-viscosity polymer which is cured by a polycondensation reaction. The copolymer-type acrylate oligomer as a main component may be epoxy acrylate, urethane acrylate, polyester acrylate, polyether acrylate, and other copolymers. Acrylate monomers include isoamyl acrylate, lauryl acrylate, stearyl acrylate, ethoxydiethylene glycol acrylate, 2-hydroxyethylacrylate, phenoxyethylacrylate, etc.

(b) Pattern-Forming Step

Selecting a copper sheet as a metal sheet M, explanation will be made below. A bonded body having resist layers R1, R2 for forming circuit patterns is immersed in a copper-etching solution comprising copper chloride ($CuCl_2$), hydrochloric acid (HCl) and hydrogen peroxide ($H_2O_2$), to etch copper sheet portions covered with no resist, for example, at 50° C. As the copper-etching solution, for example, a solution containing iron chloride may be used. Instead of immersing, the bonded body may be showered with the copper-etching solution. Copper sheet portions covered with no resist (unnecessary portions) are removed by this treatment, and part of the brazing material is then removed. In this example, Cu in the brazing material is mostly removed because the copper-etching solution is used, leaving residual brazing material portions containing Ag.

Figure 4:
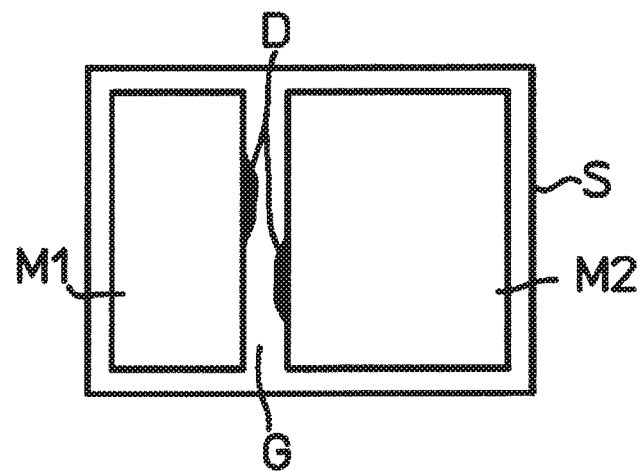
FIG. 4 is a plan view schematically showing residual brazing material portions after an unnecessary metal sheet portion is removed by etching.

FIG. 4 shows a ceramic circuit board having metal sheets M1, M2 laterally formed on a ceramic substrate S with a gap G. Brazing material portions protruding on the silicon nitride substrate S during the production of a bonded body of a silicon nitride substrate S and a copper sheet M are not completely removed by the copper-etching treatment, leaving residual brazing material portions protruding from ends of the circuit patterns (metal sheets M1, M2) in the gap G in which the copper sheet is removed by etching. They are called "brazing material protrusions D."

(c) Brazing-Material-Removing Step

Because Cu in the brazing material is mostly etched by the copper-etching treatment for forming patterns, the brazing material protrusions D are composed of other metals than Cu in the brazing material. They presumably contain, for example, Ag (alloy) and TiN (reaction product). To remove these residues, a first brazing-material-etching treatment is conducted. A second brazing-material-etching treatment is further conducted, if necessary.

(i) First Brazing-Material-Etching Treatment

The bonded body is immersed in an acidic solution comprising carboxylic acid and/or carboxylate and hydrogen peroxide (first brazing-material-etching solution), to etch the brazing material protrusions D. The first brazing-material-etching solution is preferably an aqueous solution comprising, for example, 0.083-1.7 mol/L of carboxylic acid and/or carboxylate, and 2.9-8.9 mol/L of hydrogen peroxide, and having pH of 6 or less. The concentrations of carboxylic acid and/or carboxylate are expressed by their total. Carboxylic acid and/or carboxylate in the first brazing-material-etching solution may be only carboxylic acid or carboxylate or both.

The carboxylic acids and/or carboxylates are preferably saturated or unsaturated aliphatic acids, bivalent or trivalent carboxylic acids, and their salts. Aliphatic acids may have substituent groups such as alkyl, hydroxyl, etc., preferably lower aliphatic acids having 2-4 carbon atoms. Though not restrictive, the counter salts are preferably $Li^+$, $Na^+$, $K^+$, etc. The carboxylic acids and/or carboxylates include formic acid, acetic acid, propionic acid, butyric acid, valeric acid, glycolic acid, oxalic acid, malonic acid, succinic acid, maleic acid, glutaric acid, malic acid, citric acid, etc., and their salts. Among them, formic acid, acetic acid, sodium formate, and glycolic acid are preferable, and from the aspect of cost and handling, acetic acid is most preferable. The concentration of carboxylic acid and/or carboxylate is preferably 0.1-1.5 mol/L, more preferably 0.2-1.4 mol/L, in total.

The first brazing-material-etching solution has pH of 6 or less. At pH of higher than 6, it exhibits lower capability of removing the brazing material. The pH is preferably 5 or less, more preferably 1-5, most preferably 2-4. When carboxylic acid is used, the aqueous solution is acidic, usually needing no pH adjustment. When carboxylate is used, the pH of the aqueous solution is adjusted to 6 or less by acids described below, if necessary.

In the first brazing-material-etching treatment, the dissolving speed of a residual brazing material is determined by the decomposition reaction of hydrogen peroxide, and its dissolving capability depends on the concentration of carboxylic acid and/or carboxylate. For example, 3% by mass (0.5 mol/L) of acetic acid can dissolve 10 g/L of Ag. Because the decomposition reaction of hydrogen peroxide largely varies depending on the temperature, the temperature of a chain-reacting solution is stably kept preferably in a range from room temperature to lower than 50° C., further preferably in a range from room temperature to 40° C.

As hydrogen peroxide, commercially available hydrogen peroxide water may be used. The concentration of hydrogen peroxide is preferably 3-8 mol/L. It is preferable to use water from which impurities are removed by an ion exchange resin and/or a reverse osmosis membrane, which may be called "ion-exchanged water" or "deionized water."

The first brazing-material-etching solution may contain a defoaming agent, a surfactant, a pH-adjusting agent, a stabilizing agent, etc. The surfactant may be polyoxyethylenelauryl ether, polyoxyethylenestearyl ether, monoethanolamine, triethanolamine, etc. The defoaming agent may be polyoxyalkylenealkyl ether, polyoxyethylenealkylene ether, silicones, etc. The pH-adjusting agent may be alkalis such as sodium hydroxide, potassium hydroxide, ammonia water, etc.; and acids such as hydrochloric acid, sulfuric acid, nitric acid, phosphoric acid, etc. The stabilizing agent may be sulfuric acid, urea, phosphoric acid, etc. For example, the first brazing-material-etching solution preferably contains 0.1-1.0% by mass of sulfuric acid, 1.0-5.0% by mass of urea, 10-100 ppm by mass of phosphoric acid, etc. They may be used in the second and third brazing-material-etching solutions described later.

As the etching continues, components are gradually consumed in the first brazing-material-etching solution, resulting in the decreased capability of removing the brazing material. The deteriorated first brazing-material-etching solution may be exchanged to a new first brazing-material-etching solution, or supplemented with components for the first brazing-material-etching solution, to recover the brazing-material-capability. When the etching solution is entirely exchanged, the old first brazing-material-etching solution is discarded from a first etching bath, which is then filled with a new first brazing-material-etching solution. Etching with an entirely exchanged solution without supplementing components is identified as "no supplement," and etching while supplementing components to the solution is identified as "with supplement." The latter is a method in which consumed components are supplemented.

(i-1) Etching with No Supplement

When the brazing material is etched by immersing samples in the solution without supplementing components, the total concentration of carboxylic acid and/or carboxylate is preferably about 0.2-1.4 mol/L to keep balance with the amount of hydrogen peroxide decomposed. When a solution containing only carboxylic acid and/or carboxylate in water is used, a residual brazing material cannot be etched.

(i-2) Etching with Supplement

Because hydrogen peroxide is gradually decomposed in the first brazing-material-etching solution as the etching treatment of immersed samples proceeds, hydrogen peroxide is supplemented to the solution step by step, to always keep hydrogen peroxide in a proper concentration range. With carboxylic acid and/or carboxylate adjusted at high concentrations (for example, about 2.5 mol/L) in advance, exchange may be conducted when the concentration of carboxylic acid and/or carboxylate decreases to a certain level (for example, 0.33 mol/L or less) by supplementing hydrogen peroxide. This method enjoys a reduced frequency of exchanging solutions, effective for mass treatment. Namely, a life of the first brazing-material-etching solution in the first etching bath can be expanded, contributing to cost reduction. When the first brazing-material-etching solution is showered instead of immersing, higher concentrations of carboxylic acid and/or carboxylate are effective for sufficient dissolving capability, because the step-by-step measurement of the concentration of hydrogen peroxide is generally difficult. Because carboxylic acid and/or carboxylate may corrode stainless steel forming the apparatus and drainage facilities, their concentrations may be set as low as providing substantially no adverse effect on stainless steel.

(ii) Second Brazing-Material-Etching Treatment

After the first brazing-material-etching treatment, if necessary, the bonded body is preferably immersed in an acidic solution comprising ammonium fluoride and hydrogen peroxide (second brazing-material-etching solution), to etch a residual brazing material remaining after the first brazing-material-etching treatment. The second brazing-material-etching solution is an aqueous solution comprising ammonium fluoride and hydrogen peroxide, preferably an aqueous solution comprising 0.7-2.1 mol/L of ammonium fluoride, and 2.9-8.9 mol/L of hydrogen peroxide, and having pH of 5 or less.

As ammonium fluoride, ammonium hydrogen fluoride [chemical formula: $(NH_4)HF_2$] as a hydrogen salt, or ammonium fluoride [chemical formula: $NH_4F$] as a normal salt are usable. The former may be called acidic ammonium fluoride. When the latter is used, ammonium fluoride as a normal salt should be properly handled to avoid the generation of HF and ammonia by decomposition, and sulfuric acid, etc. should be added to adjust pH (to avoid weak alkalization), thereby keeping the solution acidic. Accordingly, ammonium hydrogen fluoride is preferably used. The concentration of ammonium fluoride is preferably 1-2 mol/L, more preferably 1.2-1.8 mol/L.

As hydrogen peroxide, commercially available hydrogen peroxide water may be used. The concentration of hydrogen peroxide is preferably 3-8 mol/L. Water used is preferably water from which impurities are removed by an ion exchange resin and/or a reverse osmosis membrane, which is called ion-exchanged water or deionized water.

The pH of the second brazing-material-etching solution is 5 or less. At pH of higher than 5, it has low capability of removing the brazing material. the pH is preferably 4.5 or less, more preferably 1-4.5, most preferably 2-4. The pH of the second brazing-material-etching solution is adjusted to 5 or less by acids or alkalis described later, if necessary. The temperature of the second brazing-material-etching solution is kept preferably in a range from room temperature to lower than 50° C., more preferably in a range from room temperature to 40° C.

The second brazing-material-etching solution may contain a defoaming agent, a surfactant, a pH-adjusting agent, a stabilizing agent, etc. The defoaming agent, the surfactant, the pH-adjusting agent and the stabilizing agent may be the same compounds or agents as used in the first brazing-material-etching solution described above. For example, the second brazing-material-etching solution preferably contains 0.1-1.0% by mass of sulfuric acid, 1.0-5.0% by mass of urea, 10-100 ppm by mass of phosphoric acid, etc.

(d) Etching Step with Sodium Thiosulfate

In the pattern-forming step using a copper-etching solution, Cl⁻ ions in the copper-etching solution may form a salt of silver chloride (AgCl) with Ag ions in the brazing material, and the silver chloride may hinder a subsequent first brazing-material-etching step. To avoid such trouble, after the copper-etching treatment and before the first brazing-material-etching step, the bonded body may be immersed in a sodium thiosulfate solution to etch silver chloride, if necessary. When silver chloride is formed little in the pattern-forming step, the etching treatment with a sodium thiosulfate solution may be omitted. This etching treatment with sodium thiosulfate is conducted, for example, by immersing the bonded body in an aqueous solution containing 5-15% by mass of sodium thiosulfate for 10-30 minutes, with ultrasound applied. The temperature of the solution is preferably 10-30° C. With silver chloride etched by sodium thiosulfate, it is possible to prevent silver chloride from hindering the first brazing-material-etching step. The treatment with sodium thiosulfate etches only silver chloride, but does not etch Ag.

(e) Other Steps

After the first brazing-material-etching step (after the second brazing-material-etching step, if any), the resist layers are removed, and a chemical polishing treatment, an anti-rust treatment, plating, etc. are further carried out to obtain a ceramic substrate having a copper circuit pattern. When an alkali-removable resist is used, the resist layers are removed with an alkaline solution (for example, an aqueous solution of 8-12% by mass of sodium hydroxide kept at about 50° C.). Apart from sodium hydroxide, potassium hydroxide may be used. The treatment temperature may be in a range of 30-70° C. Because the first and second brazing-material-etching solutions of the present invention are acidic aqueous solutions, these brazing-material-etching treatments do not remove the alkali-removable resist layers, thereby avoiding damage to the copper circuit pattern and the ceramic substrate.

The chemical polishing is effective not only to remove surface oxides formed during the treatment, but also to adjust surface conditions. Namely, demands on gloss, matt, roughness, etc. can be met by selecting etching solutions and methods depending on electronic devices such as semiconductor chips mounted onto a copper circuit pattern, and metal wiring on the ceramic substrate.

Figure 5:
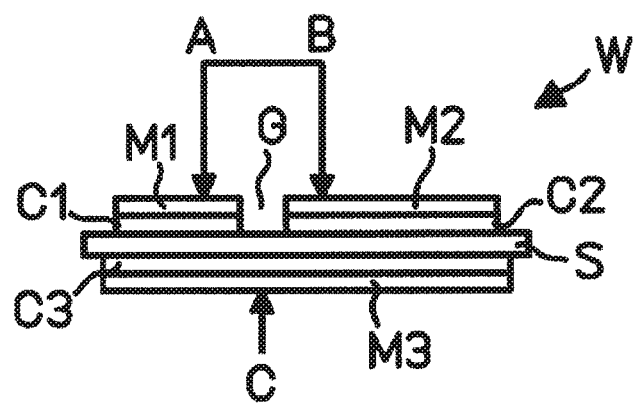
FIG. 5 is a front view showing a ceramic circuit board.

As shown in FIG. 5, the circuit board W obtained by the above method has a basic structure comprising a ceramic substrate S, two brazing materials C1, C2 formed on an upper surface of the ceramic substrate S, two metal sheets M1, M2 bonded to the ceramic substrate S via two brazing materials C1, C2, and a gap G separating the brazing materials C1, C2 and the metal sheets M1, M2 in a planar direction. The metal sheets M1, M2 act as a circuit board, on which semiconductor devices, etc. are mounted. Further, the circuit board W comprises a metal sheet M3 as a heat-dissipating plate bonded to a lower surface (rear surface) of the ceramic substrate S via a brazing material C3. A plating layer of Ni, Au, etc. may be formed on two metal sheets M1, M2, if necessary.

(2) Second Embodiment

The production method according to the second embodiment of the present invention is the same as in the first embodiment, except for carrying out the etching treatment of the bonded body with an acidic solution comprising carboxylic acid and/or carboxylate, ammonium fluoride, and hydrogen peroxide (third brazing-material-etching solution) to remove the brazing material, in place of the first and second brazing-material-removing steps. Namely, in the second embodiment, the brazing material is removed with the third brazing-material-etching solution (third brazing-material-removing step), after the bonding step and the pattern-forming step are conducted in the same manner as in the first embodiment. As in the embodiment 1, etching with sodium thiosulfate, polishing and plating are conducted, if necessary. Because other steps than the brazing-material-removing step are the same as in the first embodiment, explanation will be made below on the third brazing-material-removing step carried out in place of the first and second brazing-material-removing steps.

(f) Third Brazing-Material-Removing Step

The third brazing-material-removing step in the second embodiment uses a third brazing-material-etching solution comprising components in the first and second brazing-material-etching solutions in the first embodiment in one bath. The third brazing-material-etching solution is an acidic solution comprising carboxylic acid and/or carboxylate, ammonium fluoride, and hydrogen peroxide, for example, an aqueous solution preferably comprising 0.083-1.7 mol/L of carboxylic acid and/or carboxylate, 0.7-2.1 mol/L of ammonium fluoride, and 2.9-8.9 mol/L of hydrogen peroxide, and having pH of 6 or less. Carboxylic acid and/or carboxylate, ammonium fluoride and hydrogen peroxide used in the third brazing-material-etching solution may be the same as used in the first and second brazing-material-etching solutions.

The total concentration of carboxylic acid and/or carboxylate is preferably 0.1-1.5 mol/L, more preferably 0.2-1.4 mol/L. The concentration of ammonium fluoride is preferably 1-2 mol/L, more preferably 1.2-1.8 mol/L. The concentration of hydrogen peroxide is preferably 3-8 mol/L.

The pH of the third brazing-material-etching solution is 6 or less. At pH of higher than 6, it has low capability of removing the brazing material. The pH is preferably 5 or less, more preferably 1-5, most preferably 2-4. When carboxylic acid is used, pH adjustment is usually unnecessary because its aqueous solution is acidic. When carboxylate is used, the pH is adjusted to 6 or less by acid, if necessary. Usable acids are the same as used in the first brazing-material-etching solution.

The third brazing-material-etching solution may contain the same defoaming agent, surfactant, pH-adjusting agent, stabilizing agent, etc., as in the first and second brazing-material-etching solutions, if necessary. The defoaming agent, the surfactant, the pH-adjusting agent and the stabilizing agent may be the same compounds or agents as usable in the first and second brazing-material-etching solutions described above. For example, the third brazing-material-etching solution preferably contains 0.1-1.0% by mass of sulfuric acid, 1.0-5.0% by mass of urea, 10-100 ppm by mass of phosphoric acid, etc. Treatment conditions, such as the temperature of the third brazing-material-etching solution, etc., may be the same as in the second brazing-material-removing step.

[2] Ceramic Circuit Board (1) Structure

The ceramic circuit board comprises a ceramic substrate, at least two brazing material layers formed on the ceramic substrate via a gap, and at least two metal sheets bonded to the ceramic substrate via at least two brazing material layers. Insulation resistance between two metal sheets is preferably 500 MΩ/mm or more. The numbers of the brazing material layers and the metal sheets bonded are not restricted to 2, but may be 3 or more. In this case, 3 or more metal sheets can be bonded. With insulation resistance of 500 MΩ/mm or more between two metal sheets, insulation between two metal sheets is not broken, thereby preventing excess current from passing through semiconductor devices, in a circuit board comprising semiconductor devices mounted on two metal sheets on a ceramic substrate. The ceramic circuit board is preferably produced by the above method of the present invention.

The ceramic circuit board having such high insulation resistance as described above is obtained, for example, by removing brazing material portions remaining in a gap between two metal sheets on the ceramic substrate by the above brazing-material-removing treatment.

(2) Ceramic Substrate

Materials for the ceramic substrate used in the ceramic circuit board are not particularly restricted, but may be basically electrically insulating sintered materials. However, because semiconductor devices mounted onto the ceramic circuit board are recently operated at higher speeds while generating increased heat, the ceramic substrate is preferably made of a nitride ceramic having high thermal conductivity. Specifically, the ceramic substrate is preferably composed of sintered aluminum nitride comprising aluminum-nitride-based main phase particles and sintering-aid-based grain boundary phases existing between the particles, or a silicon-nitride-based sintered body comprising silicon-nitride-based main phase particles and sintering-aid-based grain boundary phases existing between the particles. From the aspect of mechanical strength and fracture toughness, the ceramic substrate S is more preferably composed of a silicon-nitride-based sintered body.

When the ceramic substrate is formed by a sintered nitride ceramic comprising main phase particles based on silicon nitride or aluminum nitride, and sintering-aid-based grain boundary phases existing between the particles, the maximum diameter of pores on the ceramic substrate surface in the gap is preferably 2-15 μm. When the maximum diameter of the pores is less than 2 μm, additives may not be fully removed by a washing agent. When the maximum diameter of the pores is more than 15 μm, the ceramic substrate has low strength, so that the ceramic circuit board exhibits poor reliability, for example, in a cooling and heating cycle.

The ceramic substrate composed of a silicon-nitride-based sintered body can be produced, for example, by mixing starting material powders comprising 90-97% by mass of silicon nitride and 0.5-10% by mass of a sintering aid, which may contain Mg or Y and other rare earth elements, with proper amounts of an organic binder, a plasticizer, a dispersant and an organic solvent by a ball mill, etc. to form a slurry, forming the slurry into a thin ceramic green sheet by a doctor blade method or a calendar rolling method, punching or cutting the green sheet to a desired shape, and sintering it at a temperature of 1700-1900° C. When the sintering aid is more than 10% by mass, the ceramic substrate is not sufficiently bonded to the ceramic circuit board. When the sintering aid is less than 0.5% by mass, silicon nitride particles are not fully sintered. The amount of the sintering aid is more preferably 3-10% by mass. To obtain high thermal conductivity and high strength, the sintering aid preferably comprises 2-4% by mass (as magnesium oxide) of magnesium (Mg), and 2-5% by mass (as yttrium oxide) of yttrium (Y).

(3) Metal Sheet

Materials for the metal sheet constituting the ceramic circuit board are not particularly restricted, as long as the metal sheet can be bonded by the brazing material, and has a higher melting point than that of the brazing material. For example, copper, copper alloys, aluminum, aluminum alloys, silver, silver alloys, nickel, nickel alloys, nickel-plated molybdenum, nickel-plated tungsten, and nickel-plated iron alloys may be used for the metal sheet. Among them, copper or copper-containing alloys are most preferable, because of high electric resistance, ductility and thermal conductivity (low thermal resistance), low migration, etc. Aluminum or aluminum-containing alloys are preferable because of their plastic deformability which provides high mounting reliability in a cooling and heating cycle, despite lower electric resistance and thermal conductivity (higher thermal resistance) than those of copper.

(4) Brazing Material Layer

The brazing material layers C1-C3 bonding the metal sheets M1-M3 to the ceramic substrate S are preferably made of an active Ag—Cu brazing material, which is based on Ag and Cu having a eutectic composition for high strength, high sealability, etc., and contains active metals such as Ti, Zr, Hf, etc. Further, from the aspect of bonding strength between the ceramic substrate and the metal sheet, an active Ag—Cu—In brazing material containing In in an active Ag—Cu brazing material is more preferable. As described above, the metal sheet is bonded to the ceramic substrate S, using a brazing material paste comprising brazing material component powders in an organic binder.

The present invention will be explained in more detail referring to Examples below, without intention of restricting the present invention thereto.

Example 1

(1) Formation of Bonded Body

Brazing material layers c1, c2 comprising Ag and Cu as main components and further active metallic Ti were formed as shown in FIG. 1 by a screen-printing method, on both sides of a silicon nitride substrate S (area: 50 mm×50 mm, and thickness: 150 μm). Using MgO and $Y_2O_3$ for sintering aids, the silicon nitride substrate S was composed of silicon nitride particles and grain boundary phases containing a rare earth element. A paste was obtained by blending 100 parts by mass of alloy powders comprising 70% by mass of Ag, 3% by mass of In, and 27% by mass of Cu, with 0.3 parts by mass of $TiH_2$, and an organic solvent, and the brazing material layers c1, c2 were formed by the paste.

After the brazing material coated on the substrate was dried, 0.3-mm-thick copper sheets M were attached to the circuit pattern side (front side) and the heat dissipation pattern side (rear side), and heat-treated at 750-850° C. for 20 minutes in vacuum while being compressed, to form a bonded body of the silicon nitride substrate S and the copper sheets M. Brazing material layers C1, C2 as thick as about 30 μm were formed between the silicon nitride substrate S and the copper sheets M.

(2) Coating of Resist

The copper sheet M of each bonded body was coated with an ultraviolet-curable etching resist ink, and then irradiated with ultraviolet rays to cure the etching resist ink, thereby forming resist layer patterns R1, R2. This etching resist ink was removable with alkali.

(3) Formation of Patterns

By etching with a copper-chloride-based etching solution containing copper chloride, hydrochloric acid and hydrogen peroxide at 30° C., an unnecessary copper sheet portion other than the patterns (a copper sheet portion free of a resist) was removed to form circuit patterns. The treated substrate surface had copper sheet circuit patterns M1, M2, and a 1-mm gap G separating the copper sheets M1, M2. When the bonded body of the silicon nitride substrate S and the copper sheets M was produced, brazing material portions D protruded from the copper sheets M in the gap G on the silicon nitride substrate S, and were not completely removed (see FIG. 4). The brazing material protrusions D had metallic gloss.

(4) Brazing-Material-Removing Step

To remove the brazing material protrusions D, a first brazing-material-etching treatment (etching with an acidic solution comprising carboxylic acid and/or carboxylate and hydrogen peroxide), and a second brazing-material-etching treatment (etching with a solution containing ammonium hydrogen fluoride and hydrogen peroxide) were successively conducted as described below.

(i) First Brazing-Material-Etching Treatment

Because most of Cu was removed by a copper-etching treatment for the formation of patterns as described above, the brazing material protrusions D presumably had a composition comprising a main phase of Ag and a TiN phase. To remove mainly Ag, etching with an acidic solution comprising carboxylic acid and/or carboxylate and hydrogen peroxide was conducted as the first brazing-material-etching step.

The bonded body having brazing material protrusions D was immersed in an aqueous solution containing 3% by mass (0.5 mol/L) of acetic acid and 20% by mass (5.9 mol/L) of hydrogen peroxide and having pH of 3 (first brazing-material-etching solution), at 30° C. for 20 minutes. Ion-exchanged water was used in the first brazing-material-etching solution. The brazing material protrusions D having metallic gloss after forming patterns lost metallic gloss by the first brazing-material-etching treatment, resulting in clear contrast between the silicon nitride substrate S and the brazing material protrusions D.

(ii) Second Brazing-Material-Etching Treatment

To remove Ag, TiN (reaction product), etc., which were not removed by the first brazing-material-etching treatment, etching with a solution containing ammonium hydrogen fluoride and hydrogen peroxide was conducted as the second brazing-material-etching treatment.

The bonded body after the first brazing-material-etching treatment was immersed in an aqueous solution containing 4% by mass (0.7 mol/L) of ammonium hydrogen fluoride, 26% by mass (7.6 mol/L) of hydrogen peroxide, 1% by mass (0.2 N) of sulfuric acid, 3% by mass (0.5 mol/L) of urea, and 100 ppm (1.0 mmol/L) of phosphoric acid, and having pH of 3 (second brazing-material-etching solution), at 40° C. for 20 minutes. Ion-exchanged water was used in the second brazing-material-etching solution. The brazing material protrusions were substantially removed by the second brazing-material-etching treatment.

(5) Removal of Resist Layers, Chemical Polishing and Ni Plating

After the second brazing-material-etching treatment, the bonded bodies were treated with an aqueous solution of 3% by mass of sodium hydroxide to remove the resist layers. After chemical polishing and washing with ion-exchanged water, circuit patterns on the front side and a copper sheet on the rear side were plated with Ni. The chemical polishing for gloss was conducted with a commercially available sulfuric-acid-based solution. Thus, a ceramic circuit board (silicon nitride circuit board) shown in FIG. 5 was obtained.

Examples 2-10

Ceramic circuit boards were produced in the same manner as in Example 1, except for changing the treatment temperature and time in the first and second brazing-material-etching treatments as shown in Table 1.

Comparative Example 1

A ceramic circuit board was produced in the same manner as in Example 2, except that the first brazing-material-etching treatment was not conducted.

In the resultant ceramic circuit boards (10 samples each) of Examples 1-10 and Comparative Example 1, brazing material protrusions were observed by an optical microscope. Samples having brazing material protrusions D as long as 0.2 mm or more in a direction perpendicular to the gap G (lateral direction in FIG. 4) were judged as "failed," because the brazing material protrusions D had adverse effect on wiring insulation, and samples having brazing material protrusions D of less than 0.2 mm, if any, were judged as "passed," because sufficient insulation was secured between the metal sheets. 10 samples in each Example and Comparative Example were measured to determine a pass rate by the following formula:

Pass rate (%)=[number of samples passed/(number of samples passed+number of samples failed)]× 100.

Evaluation was made by the standards below. The evaluation results are shown in Table 1.
 Good: The pass rate was 90% or more.
 Fair: The pass rate was less than 90% and more than 60%.
 Poor: The pass rate was 60% or less.

TABLE 1

| No. | First Brazing-Material-Etching Treatment | | Second Brazing-Material-Etching Treatment | | Pass Rate |
|---|---|---|---|---|---|
| | Temp. (° C.) | Immersion Time (min) | Temp. (° C.) | Immersion Time (min) | |
| Example 1 | 30 | 20 | 40 | 20 | Good |
| Example 2 | 30 | 20 | 40 | 30 | Good |
| Example 3 | 30 | 30 | 40 | 20 | Good |
| Example 4 | 30 | 30 | 40 | 30 | Good |
| Example 5 | 30 | 40 | 40 | 10 | Good |
| Example 6 | 30 | 40 | 40 | 20 | Good |
| Example 7 | 30 | 40 | 40 | 30 | Good |
| Example 8 | 40 | 30 | 40 | 30 | Good |
| Example 9 | 40 | 40 | 40 | 20 | Good |
| Example 10 | 40 | 40 | 40 | 30 | Good |
| Com. Ex. 1 | — | — | 40 | 30 | Poor |

All the ceramic circuit boards of Examples 1-10 had pass rates of 90% or more, indicating that ceramic circuit boards can be produced at high pass rates by the first and second etching treatments. In Examples, alkali-removable resist layers were not dissolved because mixed solutions used in the first and second etching steps were not alkaline, resulting in no damages on the copper circuit patterns. Also, such voids as generated by an alkaline solution treatment were not formed on the ceramic substrate surface, avoiding damages on the silicon nitride substrate.

In Comparative Example 1, only the second brazing-material-etching step using ammonium hydrogen fluoride and hydrogen peroxide was conducted, without the first brazing-material-etching step using acetic acid and hydrogen peroxide. Accordingly, the brazing material was not fully removed, resulting in a pass rate of 60% or less. Thus, another step of discarding poor products is needed in the method of Comparative Example 1.

Example 11

Ceramic circuit boards were produced in the same manner as in Example 1, except that each bonded body having brazing material protrusions D was immersed in an aqueous solution comprising 3% by mass (0.5 mol/L) of acetic acid, 4% by mass (0.7 mol/L) of ammonium hydrogen fluoride, 26% by mass (7.6 mol/L) of hydrogen peroxide, 1% by mass (0.2 N) of sulfuric acid, 3% by mass (0.5 mol/L) of urea, and 100 ppm (1.0 mmol/L) of phosphoric acid, and having pH of 3 (third brazing-material-etching solution), at 40° C. for 30 minutes, instead of conducting the first and second brazing-material-etching treatments. The ceramic circuit boards were produced at as high a pass rate as 100% (evaluated as Good). Because the third brazing-material-etching solution was not alkaline, resist layers were not dissolved, thereby causing no damages on the circuit patterns.

Example 12

Ceramic circuit boards were produced in the same manner as in Example 1, except for using, as a brazing material, a paste obtained by blending 100 parts by mass of alloy powders comprising 65.5% by mass of Ag and 2% by mass of In, the balance being Cu, with 15 parts by mass of Ag and 0.2 parts by mass of $TiH_2$, and further with an organic solvent. The ceramic circuit boards were produced at a pass rate of 100% (evaluated as Good).

Example 13

Ceramic circuit boards were produced in the same manner as in Example 1, except for using, as a brazing material, a paste obtained by blending 100 parts by mass of alloy powders comprising 50% by mass of Ag, 25% by mass of In, and 25% by mass of Cu, with 0.2 parts by mass of Ti and an organic solvent. The ceramic circuit boards were produced at a pass rate of 100% (evaluated as Good).

Examples 14-18

Ceramic circuit boards were produced in the same manner as in Example 1, except for changing the amounts of acetic acid and hydrogen peroxide in the first brazing-material-etching solution, and the first brazing-material-etching treatment time as shown in Table 2. The ceramic circuit boards were produced at as high pass rates as shown in Table 2. Example 14 used 0.8% by mass (0.13 mol/L) of acetic acid, and 26% by mass (7.6 mol/L) of hydrogen peroxide; Example 15 used 1.7% by mass (0.28 mol/L) of acetic acid, and 23% by mass (6.8 mol/L) of hydrogen peroxide; Example 16 used 2.8% by mass (0.47 mol/L) of acetic acid, and 17% by mass (5.0 mol/L) of hydrogen peroxide; Example 17 used 3.0% by mass (0.5 mol/L) of acetic acid, and 24% by mass (7.1 mol/L) of hydrogen peroxide; and Example 18 used 5.1% by mass (0.85 mol/L) of acetic acid, and 10% by mass (2.9 mol/L) of hydrogen peroxide.

TABLE 2

| No. | First Brazing-Material-Etching Treatment | | | Pass Rate |
|---|---|---|---|---|
| | Immersion Time (min) | Acetic Acid (% by mass) | Hydrogen Peroxide (% by mass) | |
| Example 14 | 20 | 0.8 | 26 | Good |
| Example 15 | 20 | 1.7 | 23 | Good |
| Example 16 | 20 | 2.8 | 17 | Good |
| Example 17 | 30 | 3.0 | 24 | Good |
| Example 18 | 20 | 5.1 | 10 | Good |

Examples 19-21

Ceramic circuit boards were produced in the same manner as in Example 1, except for changing the concentrations of ammonium hydrogen fluoride and hydrogen peroxide in the second brazing-material-etching solution, and the second brazing-material-etching treatment time as shown in Table 3. The ceramic circuit boards were produced at as high pass rates as shown in Table 3. Example 19 used 15% by mass (4.4 mol/L) of hydrogen peroxide, and 3.4% by mass (0.60 mol/L) of ammonium hydrogen fluoride; Example 20 used 25% by mass (7.4 mol/L) of hydrogen peroxide, and 8.1% by mass (1.4 mol/L) of ammonium hydrogen fluoride; and Example 21 used 30% by mass (8.8 mol/L) of hydrogen peroxide, and 15% by mass (2.6 mol/L) of ammonium hydrogen fluoride.

TABLE 3

Second Brazing-Material-Etching Treatment

| No. | Immersion Time (min) | Hydrogen Peroxide (% by mass) | Ammonium Hydrogen Fluoride (% by mass) | Pass Rate |
|---|---|---|---|---|
| Example 19 | 40 | 15 | 3.4 | Good |
| Example 20 | 20 | 25 | 8.1 | Good |
| Example 21 | 20 | 30 | 15 | Good |

Examples 22-25

Ceramic circuit boards were produced in the same manner as in Example 11, except for changing the concentrations of acetic acid, ammonium hydrogen fluoride and hydrogen peroxide in the third brazing-material-etching solution, and the third brazing-material-etching treatment time as shown in Table 4. The ceramic circuit boards were produced at as high pass rates as shown in Table 4. Example 22 used 1.1% by mass (0.18 mol/L) of acetic acid, 20% by mass (5.9 mol/L) of hydrogen peroxide, and 8% by mass (1.4 mol/L) of ammonium hydrogen fluoride; Example 23 used 1.7% by mass (0.28 mol/L) of acetic acid, 23% by mass (6.8 mol/L) of hydrogen peroxide, and 4% by mass (0.70 mol/L) of ammonium hydrogen fluoride; Example 24 used 2.8% by mass (0.47 mol/L) of acetic acid, 18% by mass (5.3 mol/L) of hydrogen peroxide, and 10.5% by mass (1.8 mol/L) of ammonium hydrogen fluoride; and Example 25 used 12% by mass (2.0 mol/L) of acetic acid, 8% by mass (2.4 mol/L) of hydrogen peroxide, and 8% by mass (1.4 mol/L) of ammonium hydrogen fluoride.

TABLE 4

Third Brazing-Material-Etching Treatment

| No. | Immersion Time (min) | Acetic Acid (% by mass) | Hydrogen Peroxide (% by mass) | Ammonium Hydrogen Fluoride (% by mass) | Pass Rate |
|---|---|---|---|---|---|
| Example 22 | 30 | 1.1 | 20 | 8 | Good |
| Example 23 | 30 | 1.7 | 23 | 4 | Good |
| Example 24 | 30 | 2.8 | 18 | 10.5 | Good |
| Example 25 | 30 | 12 | 8 | 8 | Good |

Example 26

Ceramic circuit boards were produced in the same manner as in Example 1, except that after the pattern-forming step and before the first brazing-material-etching step, the bonded bodies were immersed in an aqueous solution of 10% by mass of sodium thiosulfate at 20° C. for 20 minutes for etching. The etching treatment was conducted while applying ultrasound of 600 W and 35 kHz to the aqueous sodium thiosulfate solution. Ion-exchanged water was used in the sodium thiosulfate aqueous solution. As in Example 1, the ceramic circuit boards were produced at a high pass rate (evaluated as Good).

Examples 27-37

By conducting the same etching treatment with an aqueous sodium thiosulfate solution as in Example 26 after the pattern-forming step in Examples 11 and 14-24, all ceramic circuit boards were similarly produced at high pass rates (evaluated as Good).

Example 38

Ceramic circuit boards were produced in the same manner as in Example 1, except that an aqueous solution obtained by dropping 3-N hydrochloric acid into an aqueous solution (about pH 6) comprising 2.3% by mass (0.34 mol/L) of sodium formate and 10% by mass (2.9 mol/L) of hydrogen peroxide to adjust the pH to 3 was used as the first brazing-material-etching solution, and that the bonded bodies were immersed in the above aqueous solution at 40° C. for 30 minutes for etching. The pass rate was as high as 90% or more (evaluated as Good).

Example 39

Ceramic circuit boards were produced in the same manner as in Example 1, except that an aqueous solution comprising 3.8% by mass (0.5 mol/L) of glycolic acid and 15% by mass (4.4 mol/L) of hydrogen peroxide, and having pH of about 3 was used as the first brazing-material-etching solution, and that the bonded bodies were immersed in the above aqueous solution at 40° C. for 30 minutes for etching. The pass rate was as high as 90% or more (evaluated as Good).

Insulation Breakdown Voltage Test

The ceramic circuit boards produced in Examples 1-10 and Comparative Example 1 were subjected to an insulation breakdown voltage test, which measured insulation breakdown voltage when AC voltage was applied between front and rear surfaces of each ceramic circuit board. As shown in FIG. 5, with electrodes A and B attached to the metal sheets M1 and M2 for short-circuiting between A and B, and an electrode C (not shown) attached to the metal sheet M3 on a rear surface of the ceramic circuit board, this ceramic circuit board was immersed in an insulating silicone oil at room temperature. AC voltage having a frequency of 50 Hz, which was applied between the front and rear surfaces of each ceramic circuit board (between the heat-dissipating plate and the circuit plates) by a breakdown voltage tester TOS5101 available from Kikusui Electronics Corp., was gradually increased from 0 kV to 10 kV at a speed of 0.1 kV/sec, and voltage at which insulation was broken by drastically increased leak current was regarded as insulation breakdown voltage. This measurement was carried out on 20 samples of each ceramic circuit board, and the measured values were averaged.

The passed products having brazing material protrusions of 0.2 mm or less exhibited insulation breakdown voltage of 5 kV or more, indicating that they had sufficient insulation. The failed products having brazing material protrusions of more than 0.2 mm around the copper sheets exhibited insulation breakdown voltage of less than 5 kV.

Insulation Resistance

The ceramic circuit boards produced in Examples 1-10 and Comparative Example 1 were measured with respect to insulation resistance between metal sheets. As shown in FIG. 5, DC voltage of 1000 V was applied between spherical electrodes A, B connected to arbitrary portions of the metal (copper) sheets M1 and M2, to measure resistance after 30 seconds as insulation resistance. The distance between the metal sheets M1 and M2 was 1 mm. The minimum insulation resistance measured on 10 ceramic circuit boards of each Example and Comparative Example was used for evaluation. The insulation resistance was 500 MΩ/mm or more between terminals in the passed products having brazing material protrusions of 0.2 mm or less, while it was less than 500 MΩ/mm between terminals in the failed products having brazing material protrusions of more than 0.2 mm.

It was verified by Examples above that by the first and second brazing-material-etching treatments (or the third brazing-material-etching etching treatment) for removing residual brazing materials in a gap G between circuit patterns (copper circuits), ceramic circuit boards with sufficient insulation between circuits can be produced at high pass rates. Because high pass rates can be achieved even with a small gap G, the method of the present Invention is Suitable for Producing Small or High-Power Ceramic Circuit Boards.

EFFECT OF THE INVENTION

Because the brazing-material-removing step uses an etching solution comprising carboxylic acid and/or carboxylate, and hydrogen peroxide in the method of the present invention for producing a ceramic circuit board, brazing materials are highly efficiently removed, without eroding an alkali-removable etching resist because the etching solution is acidic. Accordingly, ceramic circuit boards can be produced at high pass rates. Because inexpensive and easy-to-handle carboxylic acid or its salt is used, the method is highly safe with large cost advantages.

What is claimed is:

1. A method for producing a ceramic circuit board comprising the steps of:
    bonding a metal sheet to a ceramic substrate via a brazing material containing Ag to form a bonded body;
    etching said bonded metal sheet to form a circuit pattern;
    removing an unnecessary brazing material from said substrate provided with the circuit pattern, by etching with a first acidic solution comprising (i) at least one of carboxylic acid and carboxylate and (ii) hydrogen peroxide; and
    removing a residual brazing material from said substrate having an unnecessary brazing material removed, by etching with a second acidic solution comprising ammonium fluoride and hydrogen peroxide,
    wherein said carboxylic acid and/or carboxylate are at least one selected from the group consisting of formic acid, acetic acid, glycolic acid, and their salts.

2. The method for producing a ceramic circuit board according to claim 1, wherein said first acidic solution is an aqueous solution comprising (i) 0.083-1.7 mol/L of at least one of carboxylic acid and carboxylate, and (ii) 2.9-8.9 mol/L of hydrogen peroxide, and having pH of 6 or less.

3. The method for producing a ceramic circuit board according to claim 1, wherein said first acidic solution further comprises at least one of sulfuric acid, urea, and phosphoric acid.

4. The method for producing a ceramic circuit board according to claim 1, wherein said second acidic solution is an aqueous solution comprising 0.7-2.1 mol/L of ammonium fluoride, and 2.9-8.9 mol/L of hydrogen peroxide, and having pH of 5 or less.

5. The method for producing a ceramic circuit board according to claim 1, wherein said second acidic solution further comprises at least one of sulfuric acid, urea, and phosphoric acid.

6. The method for producing a ceramic circuit board according to claim 1, wherein said brazing material contains Ag and an active metal.

7. The method for producing a ceramic circuit board according to claim 1, wherein said brazing material contains Ag, Cu, and an active metal.

8. The method for producing a ceramic circuit board according to claim 1, wherein said metal sheet is a copper sheet; and wherein a solution for etching the bonded metal sheet in the pattern-forming step is a copper-etching solution.

9. A method for producing a ceramic circuit board comprising the steps of:
    bonding a metal sheet to a ceramic substrate via a brazing material containing Ag to form a bonded body;
    etching said bonded metal sheet to form a circuit pattern; and
    removing an unnecessary brazing material from said substrate provided with the circuit pattern, by etching with a third acidic solution comprising (i) at least one of carboxylic acid and carboxylate, (ii) ammonium fluoride, and (iii) hydrogen peroxide,
    wherein said carboxylic acid and/or carboxylate are at least one selected from the group consisting of formic acid, acetic acid, glycolic acid, and their salts.

10. The method for producing a ceramic circuit board according to claim 9, wherein said third acidic solution is an aqueous solution comprising (i) 0.083-1.7 mol/L of at least one of carboxylic acid and carboxylate, (ii) 0.7-2.1 mol/L of ammonium fluoride, and (iii) 2.9-8.9 mol/L of hydrogen peroxide, and having pH of 6 or less.

11. The method for producing a ceramic circuit board according to claim 9, wherein said third acidic solution further comprises at least one of sulfuric acid, urea, and phosphoric acid.

12. The method for producing a ceramic circuit board according to claim 9, wherein said brazing material contains Ag and an active metal.

13. The method for producing a ceramic circuit board according to claim 9, wherein said brazing material contains Ag, Cu, and an active metal.

14. The method for producing a ceramic circuit board according to claim 9, wherein said metal sheet is a copper sheet; and wherein a solution for etching the bonded metal sheet in the pattern-forming step is a copper-etching solution.

* * * * *